US012787761B2

(12) United States Patent
Scalia et al.

(10) Patent No.: US 12,787,761 B2
(45) Date of Patent: Nov. 3, 2026

(54) SiC-BASED ELECTRONIC DEVICE WITH FUSE ELEMENT FOR SHORT-CIRCUITS PROTECTION, AND MANUFACTURING METHOD THEREOF

(71) Applicant: STMICROELECTRONICS S.r.l., Agrate Brianza (IT)

(72) Inventors: Laura Letizia Scalia, San Giovanni la Punta (IT); Cateno Marco Camalleri, Catania (IT); Edoardo Zanetti, Valverde (IT); Alfio Russo, Biancavilla (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 435 days.

(21) Appl. No.: 18/450,789

(22) Filed: Aug. 16, 2023

(65) Prior Publication Data

US 2024/0071912 A1 Feb. 29, 2024

(30) Foreign Application Priority Data

Aug. 26, 2022 (IT) ........................ 102022000017676

(51) Int. Cl.

| | |
|---|---|
| ***H10W 20/49*** | (2026.01) |
| ***H10D 30/01*** | (2025.01) |
| ***H10D 30/63*** | (2025.01) |
| ***H10D 62/832*** | (2025.01) |
| ***H10W 74/47*** | (2026.01) |

(52) U.S. Cl.

CPC ........ *H10W 20/493* (2026.01); *H10D 30/025* (2025.01); *H10D 30/63* (2025.01); *H10D 62/8325* (2025.01); *H10W 74/47* (2026.01)

(58) Field of Classification Search

None

See application file for complete search history.

(56) References Cited

U.S. PATENT DOCUMENTS

| | | | | |
|---|---|---|---|---|
| 6,252,292 | B1 * | 6/2001 | Brintzinger ......... | H10W 20/493 438/467 |
| 2007/0210890 | A1 * | 9/2007 | Hsu ..................... | H10W 20/493 257/E23.149 |
| 2013/0214894 | A1 | 8/2013 | Bonilla et al. | |
| 2019/0304907 | A1 | 10/2019 | Chao et al. | |
| 2019/0326217 | A1 * | 10/2019 | Patané ............... | H01H 85/0241 |

FOREIGN PATENT DOCUMENTS

| | | |
|---|---|---|
| JP | S5833865 A | 2/1983 |

* cited by examiner

*Primary Examiner* — Brent A. Fairbanks
*Assistant Examiner* — Derek L Nielsen
(74) *Attorney, Agent, or Firm* — Seed Intellectual Property Law Group LLP

(57) ABSTRACT

SiC-based MOSFET electronic device comprising: a solid body; a gate terminal, extending into the solid body; a conductive path, extending at a first side of the solid body, configured to be electrically couplable to a generator of a biasing voltage; a protection element of a solid-state material, coupled to the gate terminal and to the conductive path, the protection element forming an electronic connection between the gate terminal and the conductive path, and being configured to go from the solid state to a melted or gaseous state, interrupting the electrical connection, in response to a leakage current through the protection element greater than a critical threshold; a buried cavity in the solid body accommodating, at least in part, the protection element.

19 Claims, 8 Drawing Sheets

SiC-BASED ELECTRONIC DEVICE WITH FUSE ELEMENT FOR SHORT-CIRCUITS PROTECTION, AND MANUFACTURING METHOD THEREOF

BACKGROUND

Technical Field

The present disclosure relates to an electronic device, in particular a power MOSFET, provided with a protection element, and to a method for manufacturing the electronic device.

Description of the Related Art

Numerous scientific papers have reported good switching performances of silicon carbide (SiC) MOSFET devices. From an industrial point of view, in addition to switching performances, SiC devices also have good structural robustness which is a desirable characteristic for power systems.

During the steps of manufacturing and handling the SiC wafers, the interaction between machinery and SiC wafers may cause the release of debris, due to the high hardness of SiC. Therefore, such debris may permanently deposit on the surface of the same wafers and form local defectiveness, which may impact on the functionality of the final MOSFET device.

In this regard, FIG. 1A illustrates, in lateral sectional view, a transistor 1, in particular a vertical-channel MOSFET transistor, comprising: a substrate 8 of SiC; a gate region 4, for example of polysilicon, arranged at a first surface of the substrate 8; a body region 5, extending into the substrate 8 at the first surface; a source region 6, extending into the body region 5 at the first surface of the substrate 8; and a drain region 7, extending at a second surface of the substrate 8, opposite to the first surface.

The transistor 1 has debris 2 interposed between the gate region 4 and the source region 6. Furthermore, a gate oxide layer 10 extends, above the source region 6, between the substrate 8 and the gate region 4; in particular, the debris 2 extends through the gate oxide layer 10 throughout the entire thickness of the latter, electrically connecting the source region 6 and the gate region 4 to each other. Therefore, the debris 2 is a punctual defect which short-circuits the gate region 4 with the source region 6.

FIG. 1B is a circuit representation of the transistor 1 of FIG. 1A.

In use, when the gate region 4 is biased with a biasing voltage $V_{GS}$, the debris 2 forms a conductive electrical path which causes the flow of a current $i_{SC}$ between the gate region 4 and the source region 6 (hereinafter also referred to as "short-circuit current" between the gate region 4 and the source region 6). In the presence of this current $i_{SC}$, the transistor 1 fails.

A similar problem may occur in case of imperfections resulting from the gate oxide formation process, resulting in the formation of leakage paths by direct connection or tunnel effect between the gate region 4 and the source region 6.

Similarly, defectiveness of the type described above may also, or alternatively, form between the gate region 4 and the drain region 7.

Commercially available MOSFET devices are typically formed by a plurality of transistors 1 of the type shown in FIGS. 1A, 1B, which are connected in parallel to each other and cooperate with each other in order to suitably manage the currents utilized by the specific application wherein they are used. In case of failure of even just one transistor 1, belonging to the MOSFET device, the entire MOSFET device is rejected; this causes an increase in manufacturing costs.

The need is therefore felt to provide a solution to the problems set forth above.

BRIEF SUMMARY

According to the present disclosure, an electronic device provided with a protection element and a method for manufacturing the electronic device are provided. The protection element is a fuse coupled to a gate strip.

BRIEF DESCRIPTION OF THE SEVERAL VIEWS OF THE DRAWINGS

For a better understanding of the various embodiments of the present disclosure, the embodiments are now described, purely by way of non-limiting example, with reference to the attached drawings, wherein.

DETAILED DESCRIPTION

Figure 1A:
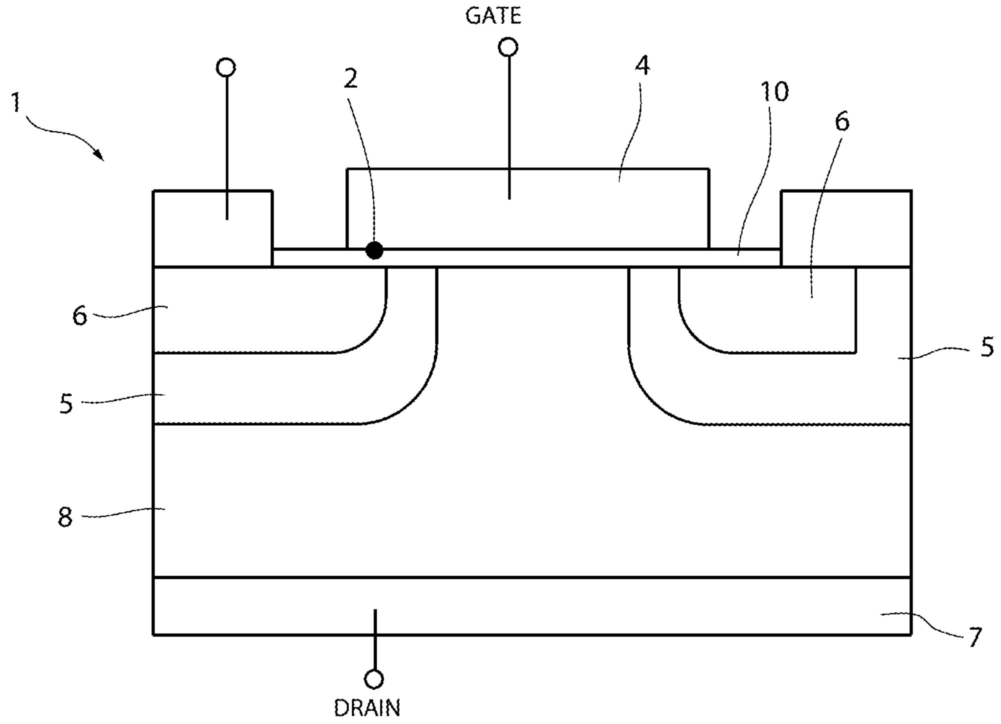
FIG. 1A Prior Art
FIG. 1A shows, in sectional view, a MOSFET transistor according to an embodiment of known type, and having defectiveness through the gate oxide that causes a direct electrical connection between the gate terminal and the source terminal.
Figure 1B:
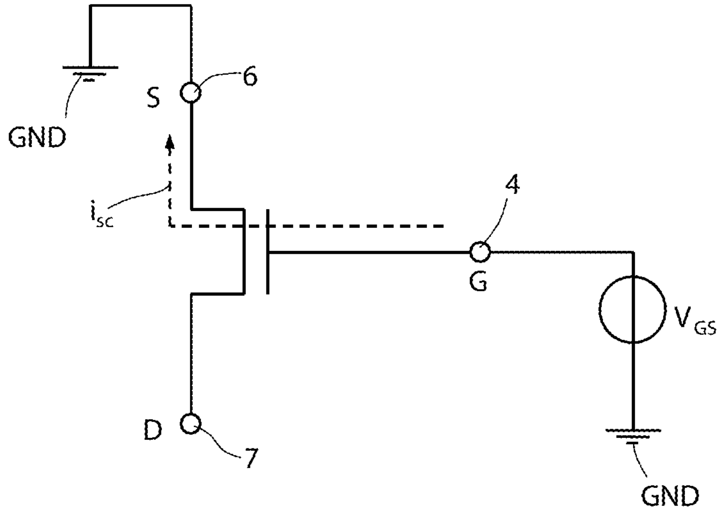
FIG. 1B Prior Art
FIG. 1B shows a circuit diagram of the MOSFET transistor of FIG. 1A.
Figure 2:
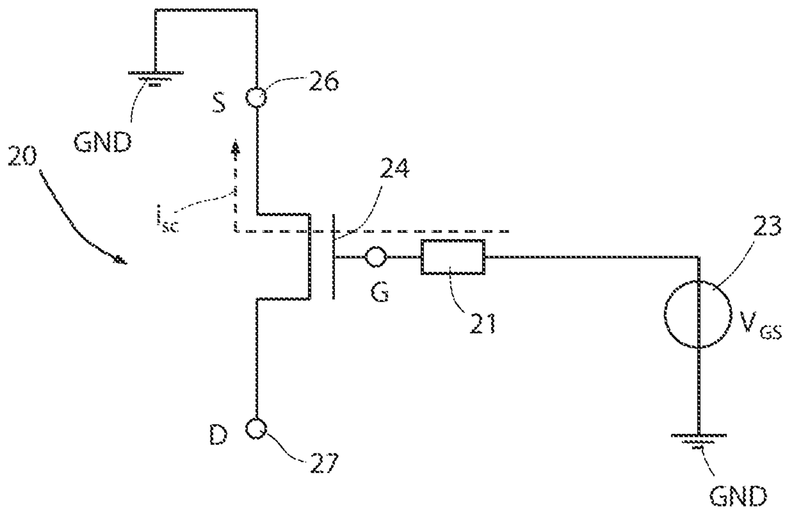
FIG. 2 shows a circuit diagram of a MOSFET transistor provided with a protection element of a fuse type, according to an aspect of the present disclosure.

FIG. 2 illustrates an equivalent circuit of a transistor 20, in particular a vertical-channel MOSFET, even more in particular a power MOSFET, according to an aspect of the present disclosure. The transistor 20 comprises, in a per se known manner and as briefly described with reference to FIGS. 1A, 1B: a gate region, or gate, 24 (forming a control terminal G) couplable, in use, to a generator 23 of a biasing voltage $V_{GS}$; a source region or source 26 (forming a first conduction terminal S); and a drain region or drain 27 (forming a second conduction terminal D).

In particular, according to an embodiment of the present disclosure, a protection element 21 is interposed between the gate region 24 and the generator 23. More in particular, the protection element 21 is a fuse configured to interrupt the electrical connection between the generator 23 and the gate region 24 in the presence of the short-circuit current $i_{SC}$ (illustrated in FIG. 1B and described with reference to this Figure), caused by the presence of the defectiveness, or punctual defect, 2 (the latter exemplarily represented in FIG. 1A, as previously described).

A MOSFET device according to an embodiment of the present disclosure is formed by a plurality (two or more) of transistors 20 of the type shown in FIG. 2, connected to each other in parallel. In case of failure of a transistor 20 that generates a flow of short-circuit current through one or more fuses 21 higher than what is expected during the normal operativeness of the device, the respective fuse 21 melts/blows, causing the interruption of the flow of short-circuit current $i_{SC}$ between the generator 23 and the source region 26 through the gate region 24 and the punctual defect 2.

Figure 3:
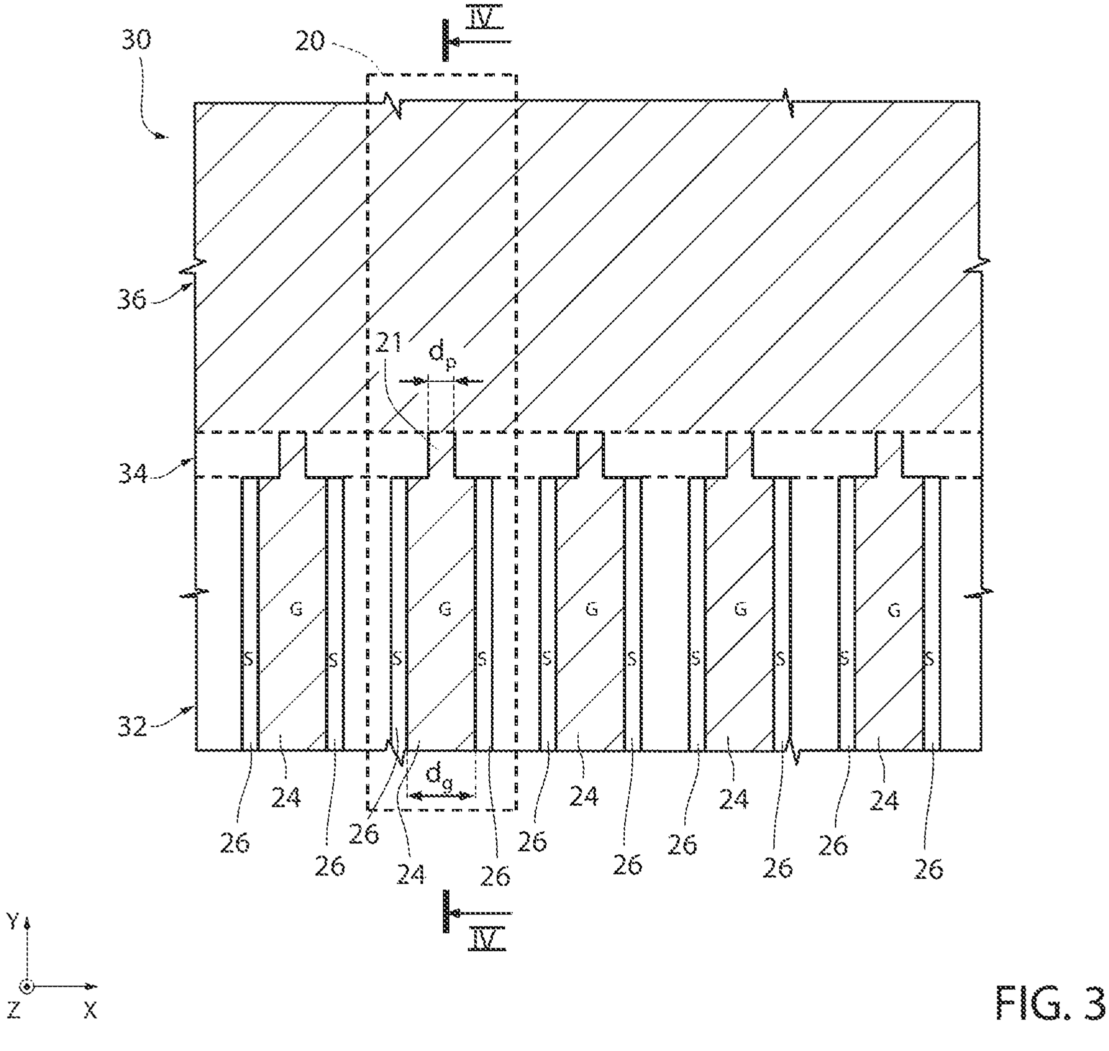
FIG. 3 shows, in plan view, a layout of a portion of a MOSFET device including a plurality of MOSFET transistors of FIG. 2.

FIG. 3 shows, in a triaxial Cartesian reference system X, Y, Z, a portion of a MOSFET device 30 according to an embodiment of the present disclosure; in particular, the MOSFET device 30 is shown in an XY-plane top view.

The MOSFET device 30 comprises an active-area region 32, a protection region 34, and a connection region 36. The protection region 34 is interposed between the active-area region 32 and the connection region 36.

In detail, the active-area region 32 includes a plurality of gate regions 24 and a plurality of source regions 26, of the strip type, each extending along a respective main direction, parallel to the Y axis, in a per se known manner.

The connection region 36 is a conductive path (e.g., having a ring-like shape) that connects all the gate regions 24 to a common gate terminal.

Each gate region 24, in particular of polysilicon or metal, has a width $d_G$, measured along the X axis, for example comprised between 1.5 μm and 4 μm.

The protection region 34 includes a plurality of protection elements 21 (also referred to as "fuses"), each of which being in electrical connection with a respective gate region 24. In particular, in the embodiment of FIG. 3, each fuse 21 is in structural and electrical continuity with the respective gate region 24. In other words, the fuse 21 and the respective gate region 24 form a monolithic structure. According to an aspect of the present disclosure, both the gate region 24 and the fuse 21 are of conductive polysilicon or of metal material. In a further embodiment, each fuse 21 is of a different material with respect to the material of the gate region 24 whereto it is coupled (e.g., the gate region 24 is of polysilicon and the fuse 21 is of metal).

Each fuse 21 has, in one embodiment, a substantially parallelepipedal shape with width $d_P$, measured along the X axis, smaller than the respective width $d_G$ of the gate region 24 whereto it is coupled. The width $d_P$ is, for example, comprised between 1 μm and 2.5 μm.

Alternatively to what has been said, in a further embodiment, each fuse 21 has dimensions (in particular width $d_P$) equal to the dimensions (in particular width $d_G$) of the gate region 24 whereto it is coupled. In this case, the short-circuits protection (i.e., the ability of the fuse 21 to melt/blow before the gate region 24) is obtained by suitably selecting the material of the fuse 21 (material having a melting point for lower temperatures with respect to the material of the gate region 24).

The connection region 36 comprises a conductive portion 25 which extends coplanar with the fuse 21 and in continuity with the fuse 21. In particular, the conductive portion 25 is of polysilicon or metal, and is electrically coupled to each fuse 21 and, through the latter, to each gate region 24; above the conductive portion 25, and in electrical contact with the conductive portion 25, a metal layer 63 extends which forms a pad configured to be electrically coupled to the generator 23, in a per se known manner.

The conductive portion 25 may have any shape, for example it extends to form a ring that follows the shape and the extension of the region 36 of FIG. 3. Alternatively, a plurality of conductive portions 25 may be present which extend in the form of a strip, each of which being electrically in contact with the metallization 63.

In one embodiment, each fuse 21 is in structural and electrical continuity with the respective conductive portion 25 in the connection region 36. In other words, the conductive portion 25, the respective fuse 21 coupled thereto and the respective gate region 24 coupled to this fuse 21 form a monolithic structure. In a different embodiment, each fuse 21 is of a material different from the material of the gate region 24 and the conductive region 25 whereto it is coupled (e.g., the gate region 24 and the conductive region 25 are of polysilicon, and the fuse 21 is of metal).

Figure 4:
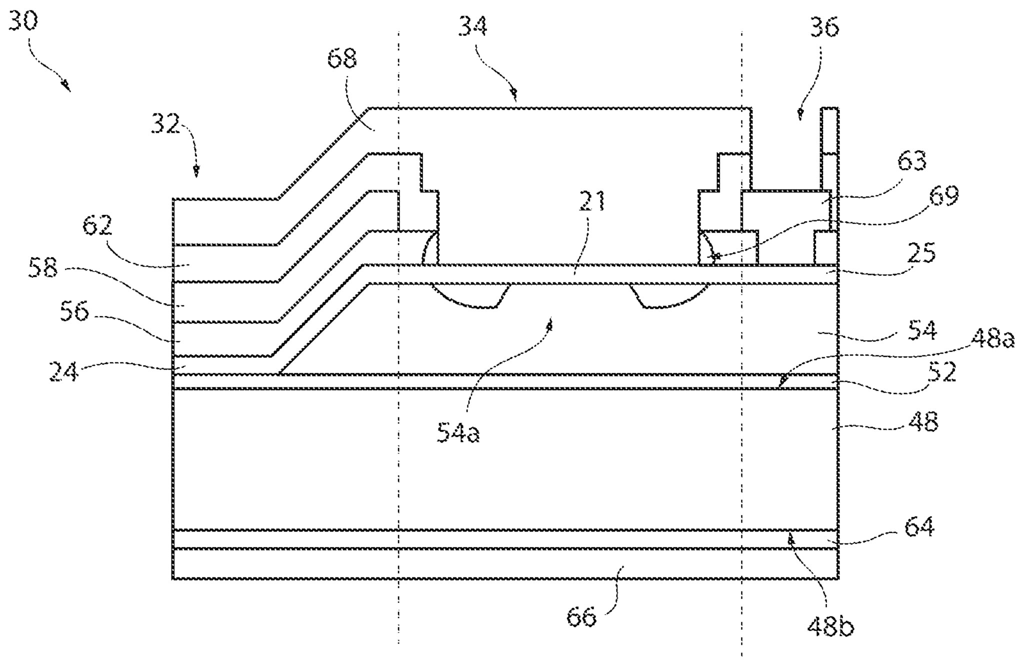
FIG. 4 is a lateral sectional view of the MOSFET device of FIG. 3, taken along scribe line IV-IV in FIG. 3, according to an embodiment of the present disclosure.

FIG. 4 shows a cross-sectional view of the MOSFET device 30 of FIG. 3; in particular, FIG. 4 is taken along scribe line IV-IV of FIG. 3.

In detail, the transistor 20 comprises a substrate 48, in particular of SiC, having a first and a second face 48*a*, 48*b* opposite to each other. In particular, in the present embodiment, the term "substrate" means a structural element which may comprise (but does not necessarily comprise) one or more epitaxial layers grown on a starting substrate.

An insulating layer 52 (in particular, a gate oxide), for example of deposited Silicon Oxide ($SiO_2$), with thickness, measured along the Z axis, comprised between 30 nm and 60 nm, extends on the first face 48*a*.

The gate region (strip) 24 extends at the active-area region 32, on the insulating layer 52.

A field plate oxide layer 54, in particular of TEOS, extends at the protection region 34 and at the connection region 36, on the insulating layer 52. The field plate oxide layer 54 has a thickness, measured along the Z axis, at the protection region 34, comprised between 0.5 μm and 2.5 μm. The field-plate-oxide layer 54 has a thickness, measured along the Z axis, at the connection region 36, comprised between 1 μm and 2 μm. One or more of the substrate 48, the insulating layer 52, and the field plate oxide layer 54 form a body of the device 30.

The fuse 21, of thickness h, measured along the Z axis, comprised between 5 μm and 15 μm extends at the protection region 34, on the field-plate-oxide layer 54. In one embodiment, the fuse 21 has a XZ-plane section (i.e., base area of the fuse 21) comprised between 0.5 and 1.5 $\mu m^2$.

According to an embodiment, as said, the fuse 21 is in electrical and structural continuity with the gate region 24. Furthermore, the fuse 21 is at least in part in electrical and structural continuity with the conductive region 25.

A further insulating layer 56 extends on the gate region 24 and on the fuse 21, at the active region 32 and at the protection region 34, respectively. The insulating layer 56 also extends at the connection region 36, above the conductive strip which extends in continuity with the fuse 21. The further insulating layer 56 is, in particular, of TEOS and has a thickness, measured along the Z axis, comprised between 500 nm and 900 nm.

A metallization layer 58, for example of Al/Si/Cu and of thickness, measured along the Z axis, comprised between 2.5 μm and 7 μm, extends at the active region 32, on the further insulating layer 56. The metallization layer 58 forms the first conduction terminal S (source) of the transistor 2 of FIG. 2.

A passivation layer 62, for example of SiN, extends at the active region 32, the protection region 34 and the connection region 36, in particular respectively on the metallization layer 58, and on the further insulating layer 56.

A metal layer 63 extends, at the connection region 36, through the insulating layer 56 and the passivation layer 62, up to electrically contacting the conductive portion 25. The metal layer 63 (and at least in part also the underlying conductive portion 25) forms the aforementioned gate ring and is therefore in electrical contact with the gate regions 24 through the respective fuses 21.

An interface layer 64, in particular of nickel silicide, extends on the second face 48*b*. A metallization layer 66, for example of Ti/Ni/Au, extends on the interface layer 64. The metallization layer 66 forms the second conduction terminal D (drain) of the transistor 20 of FIG. 2.

According to an embodiment of the present disclosure, at the protection region 34, i.e., at the fuse 21, a buried cavity 69 is present which extends completely through the insulating layer 56 (above the fuse 21 along Z) and in part through the field-plate-oxide layer 54 (below the fuse 21 along Z). The fuse 21 is supported, in the cavity 69, by a portion 54*a* of the field-plate-oxide layer 54 which protrudes within the cavity 69. The cavity 69 is closed at the top by a polymeric layer 68, in particular insulating (e.g., of Polyimide, PI, or Polyimide-Iso-IndroQuinazalinedione, PIQ). The insulating polymeric layer 68 extends above the passivation layer 62 and, at the protection region 34, extends into an opening made through the passivation layer 62 and the insulating layer 56, up to reaching the cavity 69 and the fuse 21. As better illustrated hereinbelow, the formation of the insulating polymeric layer 68 is such that the cavity 69 is not completely filled by the insulating polymeric layer 68, but is closed at the top by the insulating polymeric layer 68.

Under normal operating conditions, i.e., in the absence of defectiveness of the type shown 1A, there are no leakage currents between the gate region 24 and the source region 26 or, in any case, possible leakage currents are of the order of 10 nA (for gate biasing voltages $V_{GS}$ of the order of ±20 V), and therefore negligible. Conversely, in the presence of the aforementioned defectiveness, a current (i.e., the short-circuit current $i_{SC}$) of the order of mA or slightly less (e.g., greater than 0.8 mA) is observed.

The Applicant has verified that when, during use, the short-circuit current $i_{SC}$, in particular equal to about 1 mA, flows through the fuse 21 for a time t equal to about 1 ms, a temperature variation ΔT of the order of 104 K, develops according to the formula:

$$\Delta T = \frac{\rho i_{SC}^2 t}{cDh^2 d_P^2}$$

where ρ is the electrical resistivity of the fuse 21 (in the case of polysilicon equal to $10e^{-4}$ Ω·cm), c is the specific heat (in the case of polysilicon equal to 700 J/kg·keV), D is the density of the material of the fuse 21 (in the case of polysilicon equal to 2330 kg/m$^3$), h is the thickness along the Z axis of the fuse 21 and $d_P$ is the width along the X axis of the fuse 21.

The Applicant has also verified that such a temperature variation ΔT in the time interval considered causes the fuse 21 to melt/blow, resulting in the insulation of the transistor 20 from the generator 23 (FIG. 2).

The fuse 21 is designed in such a way as to interrupt the electrical connection between the connection region 36 (connected in use to the generator 23) and the gate region 24 in the presence of the short-circuit current $i_{SC}$ between the gate region 24 and the source region 26, whose value depends on the biasing voltage $V_{GS}$ and which is, in any case, greater than the leakage current observable under normal operating conditions. In particular, the fuse 21 is designed in such a way as to change physical state (e.g., from solid to melted or from solid to gaseous) in the presence of the short-circuit current $i_{SC}$.

In general, therefore, the fuse 21 is designed so as to interrupt the electrical connection between the connection region 36 and the gate region 24 (e.g., by changing physical state) in the presence of a current greater than a critical threshold equal to at least one order of magnitude higher with respect to the leakage current under normal operating conditions (e.g., critical threshold equal to or greater than 50 nA).

The presence of the buried cavity 69 around the fuse 21 or, in other words, the formation of the fuse 21 at least in part within the buried cavity 69, allows the material in melted state or gaseous state of the fuse 21 to flow and be gathered within the buried cavity 69. In this manner, possible problems linked to a breakdown of the device 30 caused by the local increase in pressure following the change of state of the material of the fuse 21 are overcome.

Figure 5:
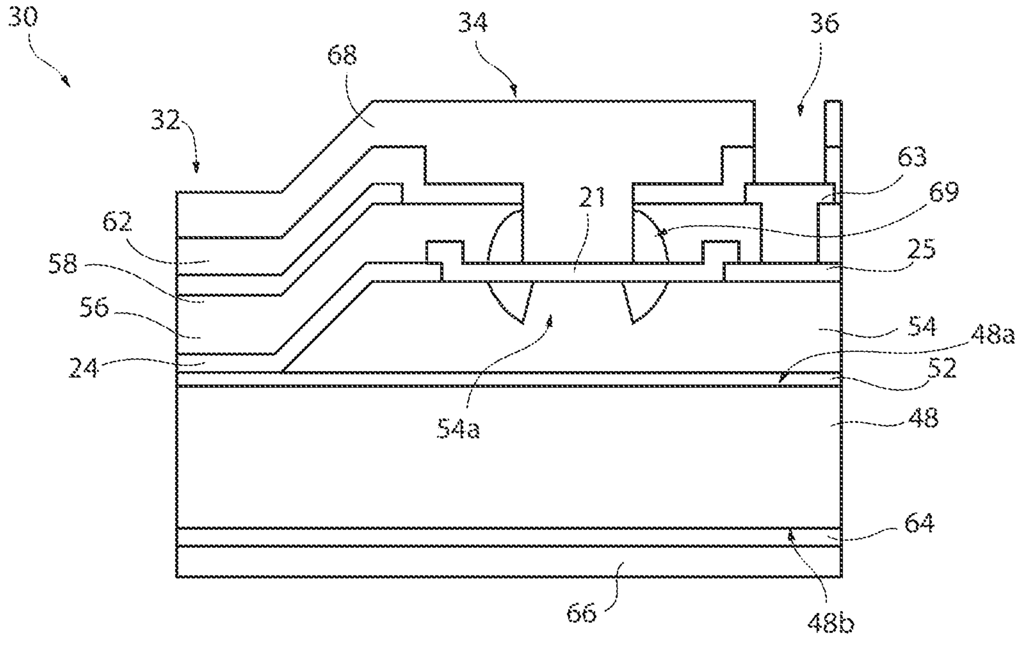
FIG. 5 is a lateral sectional view of the MOSFET device of FIG. 3, taken along scribe line IV-IV in FIG. 3, according to a further embodiment of the present disclosure.

FIG. 5 shows a cross-sectional view, taken along scribe line IV-IV, of an embodiment of the MOSFET device 30 of FIG. 3 alternative to the embodiment of FIG. 4. Elements corresponding to those shown in FIG. 4 are indicated in FIG. 5 with the same reference numbers and will not be further described.

In the embodiment of FIG. 5, each fuse 21 is in electrical continuity with the respective gate region 24 and with the conductive portion 25 extending into the connection region 36; however, in this case the gate region 24 and the conductive portion 25 do not form a monolithic body with the fuse 21. The fuse 21 is here formed by a material different from the material of the gate region 24 and the conductive portion 25 (e.g., the latter are of polysilicon and the fuse 21 is of metal).

FIGS. 6A-6E show manufacturing steps of the MOSFET device 30 of FIG. 4, according to an embodiment of the present disclosure.

Figure 6A:
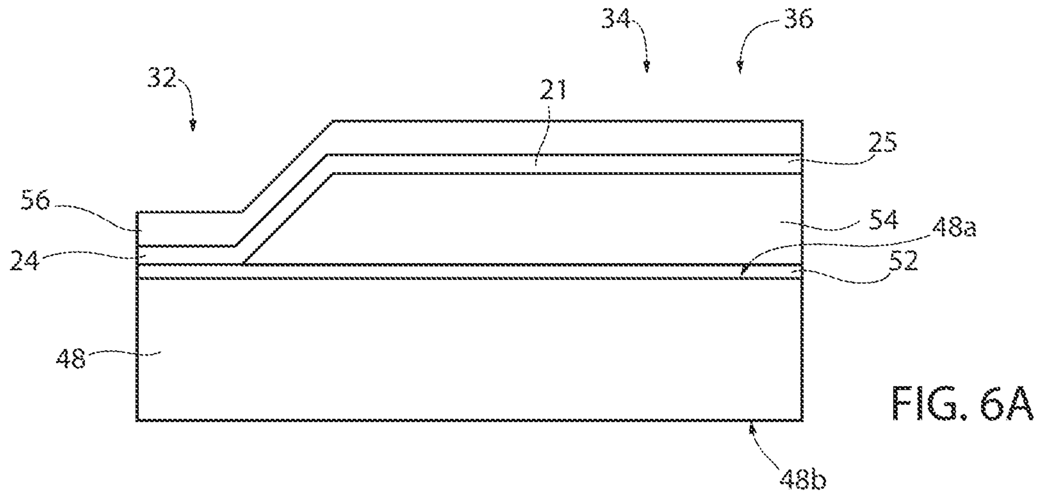
FIGS. 6A-6E illustrate, in lateral sectional view, manufacturing steps of the MOSFET device of FIG. 4, according to an embodiment of the present disclosure.

With reference to FIG. 6A, the substrate 48, for example of Silicon Carbide, SiC, is provided.

Then, on the front side 48*a*, the oxide layer 52, for example $SiO_2$, is formed by CVD deposition and/or thermal oxidation. Subsequently, the field-plate-oxide layer 54 is formed on the oxide layer 52; more in particular, the field-plate-oxide layer 54 is formed at the protection region 34 intended to accommodate the fuse 21 and at the connection region 36 intended to accommodate the gate ring. To this end, it is performed a step of depositing TEOS and subsequently patterning the same to remove the field-plate-oxide layer 54 from the active-area region 32. In this manner, at the active-area region 32, the field-plate-oxide layer 54 is removed up to reaching the underlying oxide layer 52.

Then, a conductive layer, e.g., of polysilicon, is formed over the oxide layer 52 in the active-area region 32, and over the field-plate-oxide layer 54 in the protection 34 and connection regions 36; this conductive layer is then patterned (e.g., by lithography and etching steps) to form the conductive strips relating to the gate regions 24, the fuses 21 and the conductive portions 25, in the respective regions 32, 34 and 36.

Then, the insulating layer 56 is formed by depositing TEOS on the gate regions 24, fuses 21 and conductive portions 25.

Figure 6B:
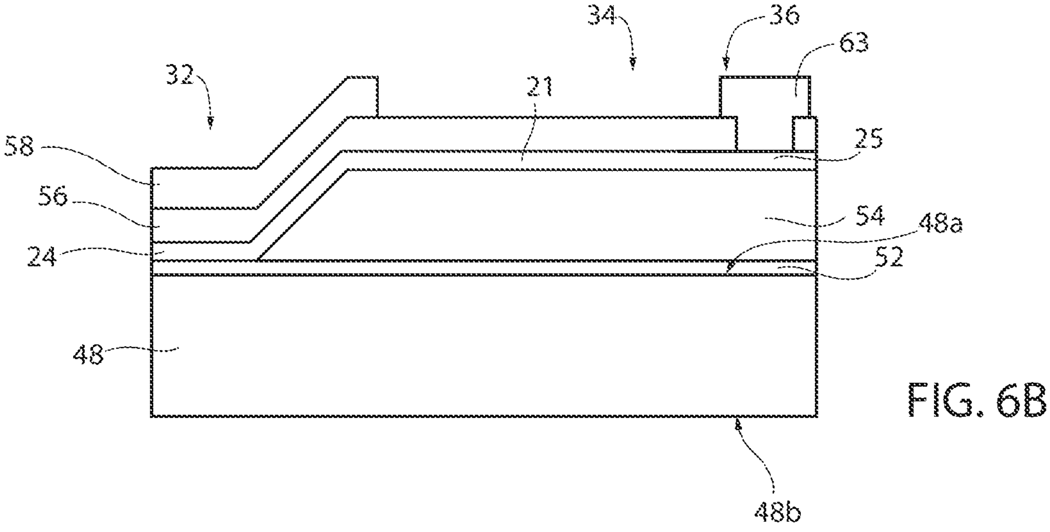

With reference to FIG. 6B, the insulating layer 56 is opened at the connection region 36 up to reaching the conductive portions 25; conductive material or a layer, in particular metal, is then deposited to form the metallizations 58 and 63. The metallizations 58 and 63 do not extend at the protection region 34.

Figure 6C:
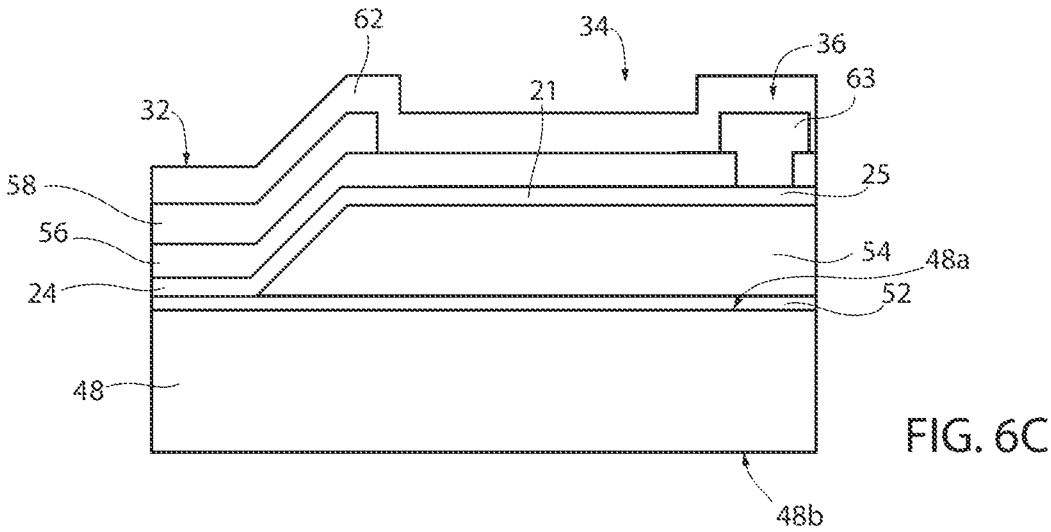

Then, FIG. 6C, the method proceeds with the formation of the passivation layer 62, depositing SiN. The passivation layer extends on the metallizations 58 and 63 and on the insulating layer 56 where the latter is exposed (protection region 34).

Figure 6D:
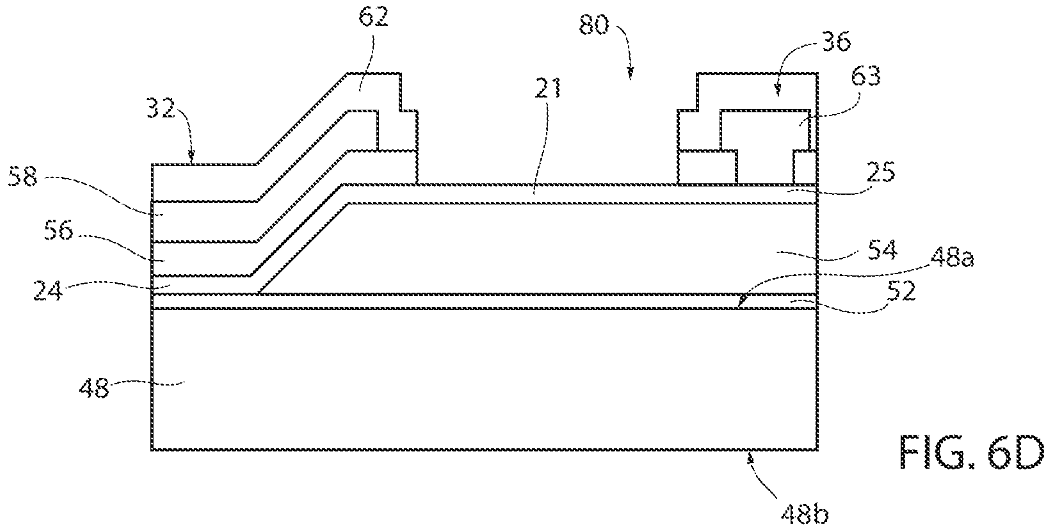

Then, FIG. 6D, a step of etching the passivation layer 62 is performed at the protection region 34 (i.e., between the metallizations 58 and 63), up to reaching the underlying insulating layer 56. The etching of the passivation layer 62 is performed where it is desired to form the fuses 21 and, in particular, the buried cavities 69 accommodating the fuses 21. Where the buried cavities 69 are not formed, the passivation layer 62 is not removed.

Figure 6E:
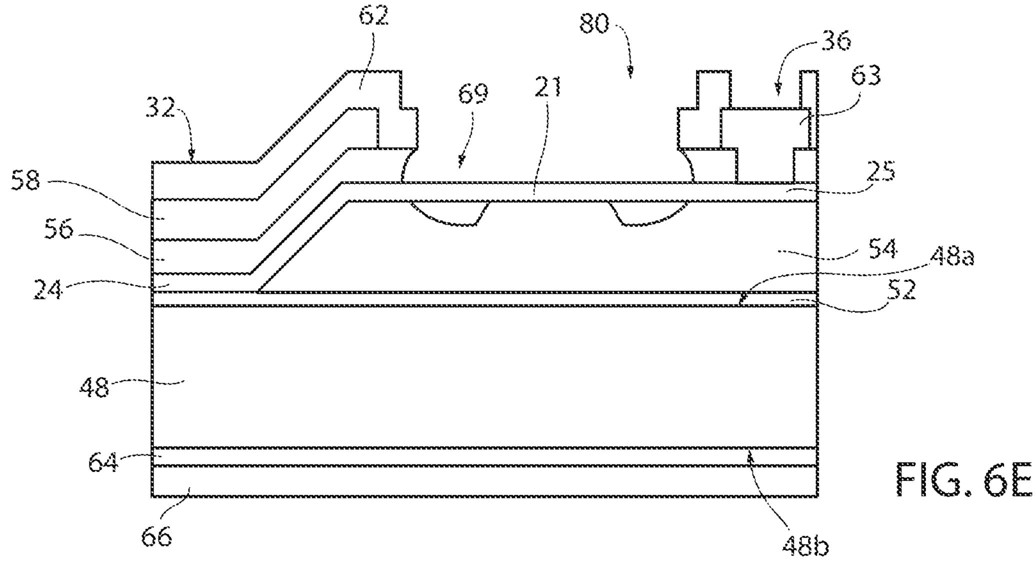

An opening 80 is thus formed wherethrough, FIG. 6E, the material of the insulating layer 56 and field-plate-oxide layer 54 may be removed, by isotropic etching, to form the buried cavity 69. Since the material of the insulating layer 56 and field-plate-oxide layer 54 is the same, a single etching, using for example HF- (hydrofluoric acid) based chemistries, is sufficient to form the cavity 69. Since, as illustrated in FIG. 3, the gate regions 24 and the fuses 21 extend in the form of a strip, forming the opening 80 having a dimension (along the Y axis) greater than the corresponding width of the relative fuse 21, the etching of the step of FIG. 6E extends to the portions of the field-plate-oxide layer 54 lateral with respect to the strip of fuse 21, removing in part the material below the fuse 21. By adjusting the etching by time, a portion of the field-plate-oxide layer 54 may be maintained below and vertically aligned to the fuse 21, in physical support of the latter, (i.e., the portion 54*a* previously described).

A step of forming the insulating polymeric layer 68, as said of Patterned Polyimide, PI, or Polyimide-Iso-IndroQuinazalinedione, PIQ, is then performed. The polymeric material PI or PIQ is deposited in a per se known manner.

The polymeric material PI or PIQ is known to be a material that may be deposited by spinning technique. When it is dispensed in the liquid phase on the rotating wafer, it forms a thin film which is then made denser, if desired, with thermal treatments. Considering the planarizing and viscosity properties of the polymeric material PI or PIQ, it does not completely penetrate within the cavity that accommodates the fuse, but closes it at the top.

The device 30 of FIG. 4 is thus obtained.

FIGS. 7A-7E show manufacturing steps of the MOSFET device 30 of FIG. 5, according to an embodiment of the present disclosure.

Figure 7A:
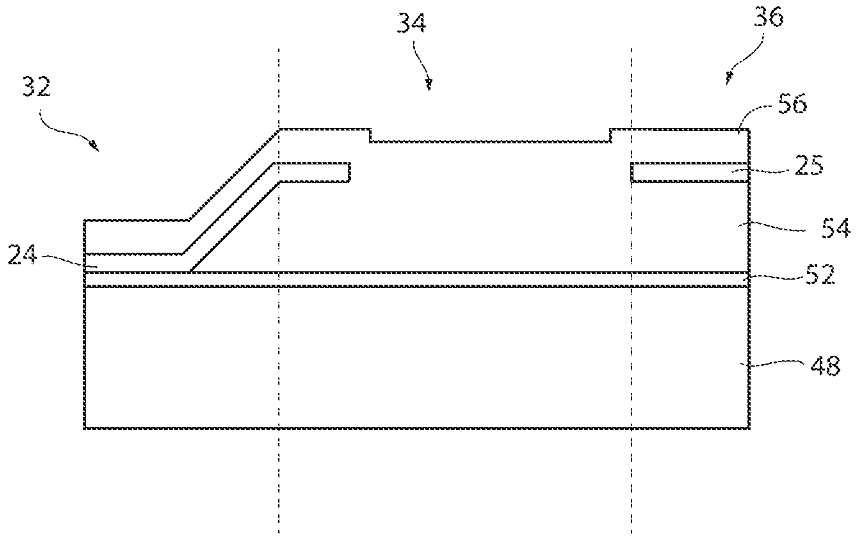
FIGS. 7A-7E illustrate, in lateral sectional view, manufacturing steps of the MOSFET device of FIG. 5, according to a further embodiment of the present disclosure.

With reference to FIG. 7A, the substrate 48, for example of Silicon Carbide, SiC, is provided.

Then, the oxide layer 52, for example $SiO_2$, is formed on the front side 48*a* as described with reference to FIG. 6A.

Subsequently, the field-plate-oxide layer 54 is formed on the oxide layer 52; more particularly, the field-plate-oxide layer 54 is formed at the protection region 34 intended to accommodate the fuse 21 and at the connection region 36 intended to accommodate the gate ring. To this end, it is performed a step of depositing TEOS and subsequently patterning the same to remove the field-plate-oxide layer 54 from the active-area region 32. In this manner, at the active-area region 32, the field-plate-oxide layer 54 is removed up to reaching the underlying oxide layer 52.

Then, a conductive layer, e.g., of polysilicon, is formed over the oxide layer 52 in the active-area region 32, and over the field-plate-oxide layer 54 in the protection 34 and connection regions 36; this conductive layer is then patterned (e.g., by lithography and etching steps) to form the conductive strips relating to the gate regions 24 and the conductive portions 25, in the respective regions 32 and 36. The polysilicon conductive layer is removed at the protection region 34, i.e., it is removed where the formation of the fuses 21 is foreseen.

Then, the insulating layer 56 is formed by depositing TEOS on the gate regions 24 and conductive portions 25, and over the field-plate-oxide layer 54 in the protection region 34 where the polysilicon layer is missing.

Figure 7B:
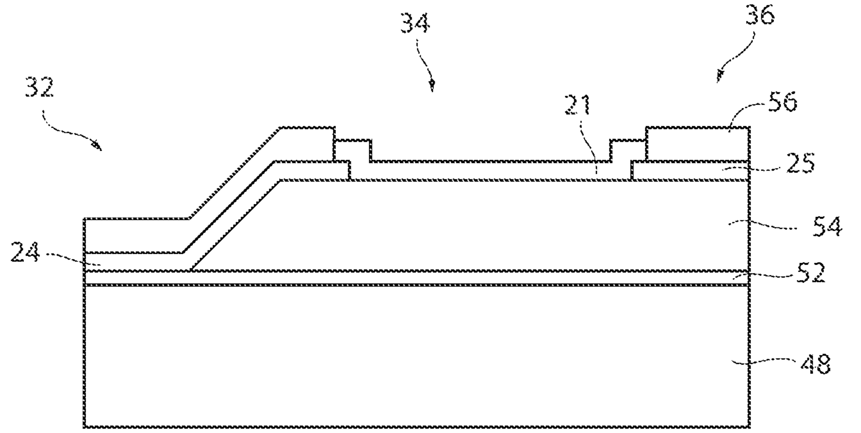
Figure 7C:
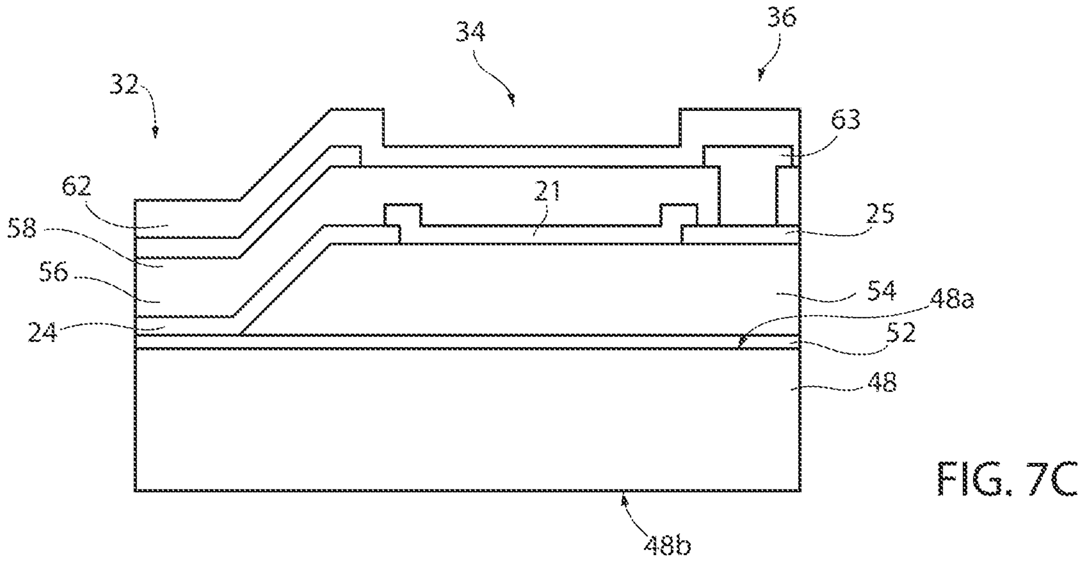
Figure 7D:
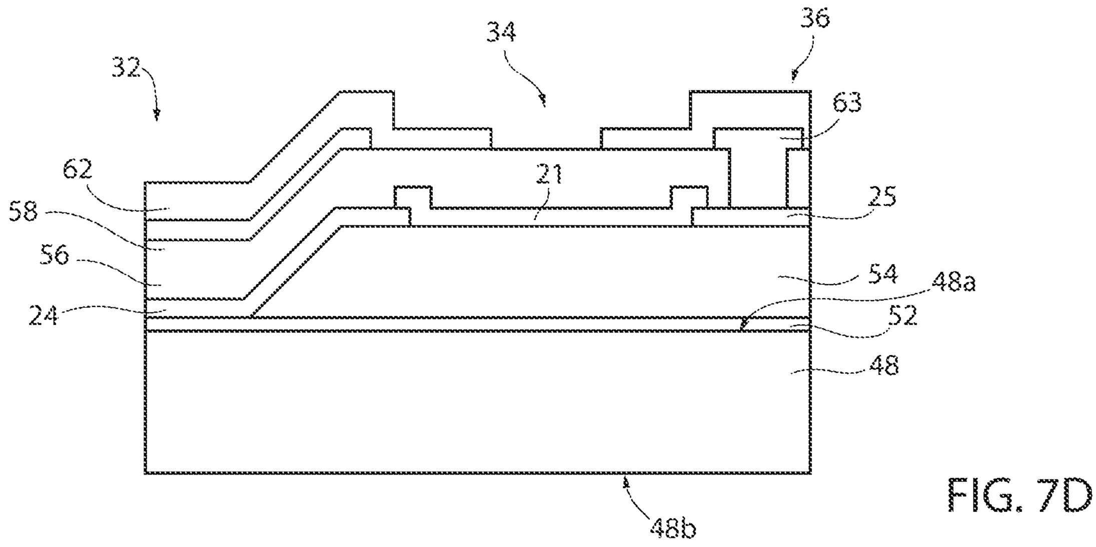
Figure 7E:
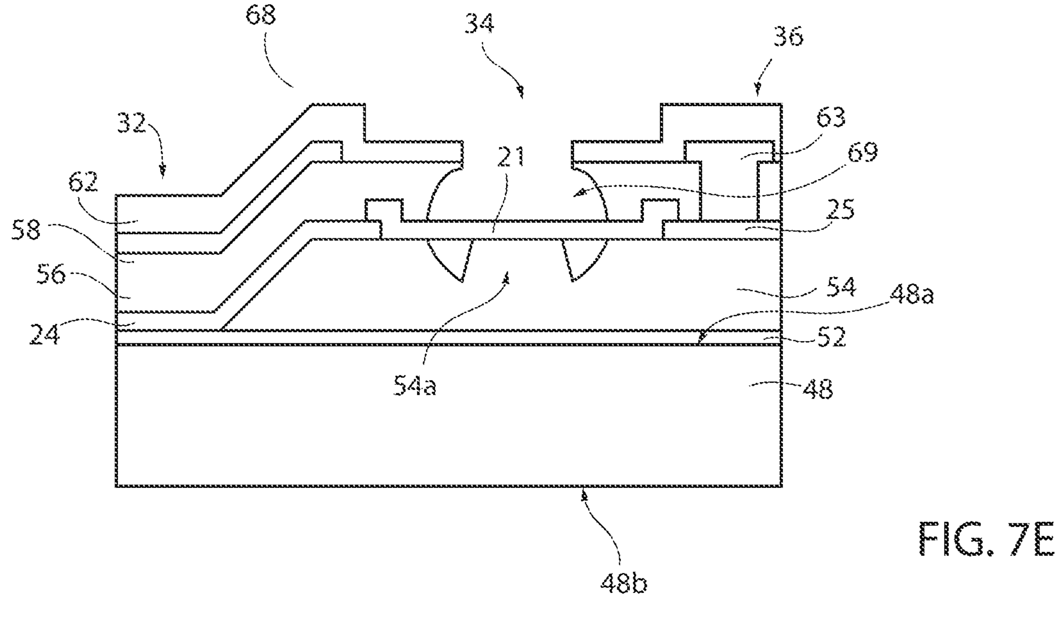

With reference to FIG. 7B, the insulating layer 56 is removed in the protection region 34, between the gate regions 24 and the conductive portions 25, exposing respective terminal portions of the gate regions 24 and of the conductive portions 25. Then a step of depositing and patterning conductive material (such as for example Ti, or TiN, or Al, or Ni), more particularly metal, is performed. The deposition of this conductive material is performed in particular on the terminal portions of the gate regions 24 and of the conductive portions 25 exposed, and on the field-plate-oxide layer 54 comprised between the gate regions 24 and the conductive portions 25. The fuses 21 are thus formed.

The method then proceeds with steps similar to those of FIGS. 6B-6E, and therefore not further described.

The device 30 of FIG. 5 is thus obtained.

From an examination of the characteristics of the various embodiments described in the present disclosure, the advantages that the embodiments affords are evident.

In particular, the fuses are implemented without modifications to the passivating cover, while the melted/gaseous material of the fuse after breaking has sufficient space to drain without negatively affecting the structure of the device.

Furthermore, in MOSFET devices formed by a plurality of transistors, connected in parallel to each other and cooperating with each other in order to suitably manage the currents utilized by the specific application wherein they are used, in case of failure of even just one transistor, belonging to the MOSFET device, the functionality of the entire MOSFET device may be restored by disconnecting the single faulty transistor, maintaining good electrical insulation characteristics and having a fractional loss on the current flow of the device.

Furthermore, in case of degradation of the insulation between the gate terminal and the source terminal of one or more transistors of the MOSFET device due to a leakage current greater than 0.8 mA, in use, the fuse relating to such one or more degraded transistors would melt, automatically segregating the degraded transistor.

Finally, it is clear that modifications and variations may be made to what has been described and illustrated herein, without thereby departing from the scope of the present disclosure.

For example, the various embodiments of the present disclosure may be applied to devices with a substrate of a material other than SiC, for example Si, GaN (gallium nitride) or glass or other material.

Furthermore, the various embodiment of the present disclosure finds applications in devices other than MOSFETs, for example GaN power devices, LDMOS ("Laterally Diffused MOS"), VMOS ("Vertical MOS"), DMOS ("Diffused MOS"), CMOS ("Complementary MOS"), or other integrated devices provided with a control terminal and at least one conduction terminal.

Furthermore, the device 30 may include one or more horizontal-channel MOSFET transistors.

Furthermore, the device 30 may be formed by a single transistor 20. In this case, the melting/blowing of the fuse 21 interrupts the operation of the entire device 30. This embodiment may be useful in the event that the device 30 is integrated in a complex electronic system and is not vital for the operation of the electronic system (for example, in the presence of redundancy), but wherein the failure of this device 30 could compromise the operation of other elements of the electronic system.

In addition, in the embodiment of FIGS. 4 and 5, the fuse 21 may be of a material different from metal or the material of the gate region 24 and/or the connection region 36, for example of a conductive polymer, with electrical resistivity lower than Q cm.

Furthermore, the fuse 21 may have a geometrical shape different from the parallelepipedal shape, such as, for example, a cylindrical or generically polyhedral shape.

According to a further embodiment, the protection element 21 is configured to interrupt the electrical connection between the connection region 36 and the gate region 24 in the absence of a change of physical state, but by breaking (direct or mediated by the presence of a further element) of the protection element 21 in the presence of the short-circuit current $i_{SC}$.

Furthermore, it is evident that the cavity 69 may have a different shape from what has been shown, depending on the type of etching used to form the cavity.

Figure 8:
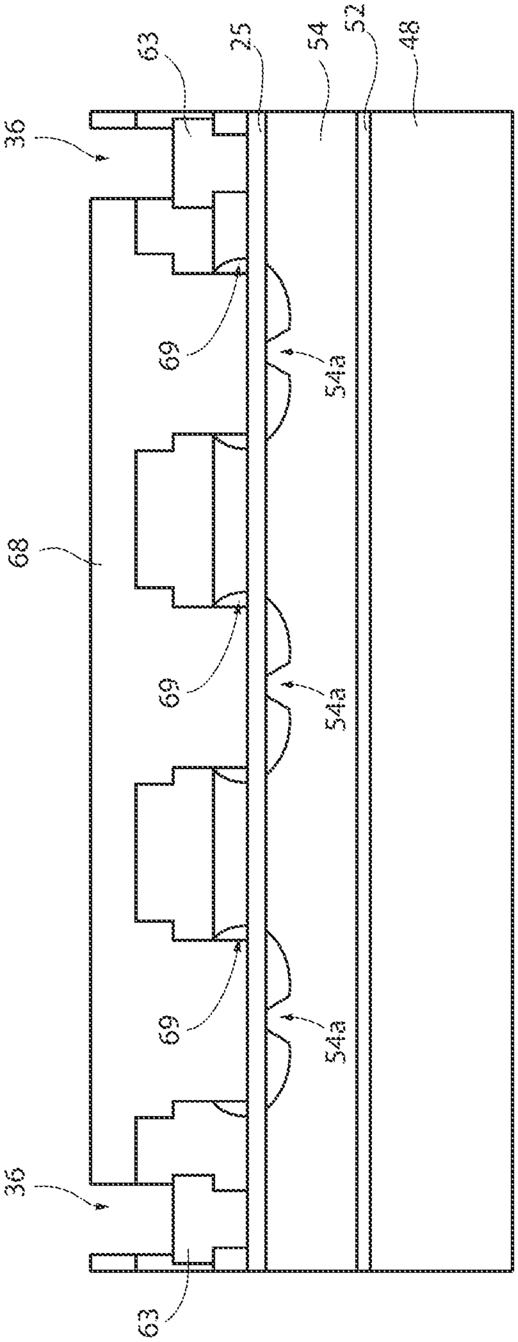
FIG. 8 is a lateral sectional view of the MOSFET device of FIG. 3, taken along scribe line IV-IV in FIG. 3, according to a further embodiment of the present disclosure.

In a further embodiment, a plurality of cavities 69 for each fuse 21 are present, arranged aligned to each other along the main extension of the fuse 21 (i.e., along the Y direction). FIG. 8 shows, by way of example, this embodiment. As may be noted, the cavities 69 extend in series with each other along Y and are separated from each other.

An electronic device (20; 30) may be summarized as including a solid body (48), in particular including Silicon Carbide; a gate terminal (24), extending into the solid body (48); a conductive path (36), extending at a first side of the solid body (48), configured to be electrically couplable to a generator (23) of a biasing voltage ($V_{GS}$) of said gate terminal (24); a protection element (21) of a solid-state material, coupled to the gate terminal (24) and to the conductive path (36), the protection element (21) forming an electrical connection between the gate terminal (24) and the conductive path (36), and being configured to go from the solid state to a melted or gaseous state, interrupting said electrical connection, in response to a leakage current ($i_{SC}$) through said protection element (21) greater than a critical threshold, characterized in that it further includes a buried cavity (69) in the solid body (48) accommodating, at least in part, said protection element (21).

The buried cavity (69) may be configured to contain material in melted or gaseous state of the protection element (21).

The buried cavity (69) may accommodate a support for supporting, at least in part, said protection element (21).

The protection element (21) may be a fuse.

The protection element (21) may be of a material having an electrical resistivity lower than 10 Ω·cm, chosen from among polysilicon, metal or conductive polymer.

The protection element (21), the gate terminal (24) and the conductive path (36) may form a monolithic structure.

The electronic device may further include a covering layer (68), in particular of polymeric material, which closes said buried cavity (69) at the top.

The covering layer (68) may extend in part into the buried cavity by physically contacting the protection element (21).

The covering layer (68) may be of Polyimide, PI, or Polyimide-Iso-IndroQuinazalinedione, PIQ.

The covering layer (68) may have a lower mechanical resistance with respect to the mechanical resistance of the solid body.

The protection element (21) may be of metal and extends in part on the gate terminal (24) and on the conductive path (36), said gate terminal (24) and said conductive path (36) being electrically coupled to each other exclusively by the protection element (21).

Said solid body may include Silicon Carbide, siC, and said device may be a vertical conduction MOSFET and may further include a source terminal (26), extending into the solid body (48) laterally to the gate terminal at a first side, of the solid body (48), and a drain terminal (66) extending at a second side, opposite to the first side, of the solid body (48).

The gate terminal (24) may be of strip type.

A method for manufacturing an electronic device (20; 30), may be summarized as including the steps of forming a gate terminal (24) in a solid body (48); forming a conductive path (36) configured to be electrically couplable to a generator (23) of a biasing voltage ($V_{GS}$) of the gate terminal; forming a protection element (21) of a solid-state material, coupled to the gate terminal (24) and the conductive path (36), the protection element (21) forming an electrical connection between the gate terminal (24) and the conductive path (36), and being configured to go from the solid state to a melted or gaseous state, interrupting said electrical connection, in response to a leakage current ($i_{SC}$) through said protection element (21) greater than a critical threshold, characterized in that it further includes the step of forming a buried cavity (69) in the solid body (48) accommodating, at least in part, said protection element (21).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
- a body including Silicon Carbide;
- a gate terminal on the body;
- a conductive path on the body, the conductive path configured to be electrically coupled to a generator of a biasing voltage of the gate terminal;
- a protection element of a solid-state material, coupled to the gate terminal and to the conductive path,
  - the protection element being an electrical connection between the gate terminal and the conductive path,
  - the protection element configured to change from a solid state to a melted or gaseous state, interrupting the electrical connection, in response to a leakage current through the protection element greater than a threshold;

a buried cavity in the body, at least a portion of the protection element extending through the buried cavity; and a support that protrudes into the buried cavity, the portion of the protection element positioned on the support inside of the buried cavity and spaced from the body by the support.

2. The electronic device according to claim 1, wherein the buried cavity is configured to contain material in melted or gaseous state of the protection element.

3. The electronic device according to claim 1, wherein the protection element is a fuse.

4. The electronic device according to claim 1, wherein the protection element is of a material having an electrical resistivity lower than 10 Ω·cm, chosen from among poly-silicon, metal, or conductive polymer.

5. The electronic device according to claim 1, wherein the protection element, the gate terminal and the conductive path form a monolithic structure.

6. The electronic device according to claim 1, further comprising:

a covering layer including polymeric material, the covering layer encloses the buried cavity.

7. The electronic device according to claim 6, wherein the covering layer partially extends into the buried cavity and physically contacts the protection element.

8. The electronic device according to claim 6, wherein the covering layer includes Polyimide (PI) or Polyimide-Iso-IndroQuinazalinedione (PIQ).

9. The electronic device according to claim 6, wherein the covering layer has a lower mechanical resistance with respect to a mechanical resistance of the body.

10. The electronic device according to claim 1, wherein the protection element includes a metal, and partially extends on the gate terminal and on the conductive path, the gate terminal and the conductive path being electrically coupled to each other exclusively by the protection element.

11. The electronic device according to claim 1, wherein The electronic device is a vertical conduction MOSFET, and further includes a source terminal extending on the body laterally to the gate terminal at a first side of the body, and a drain terminal extending at a second side, opposite to the first side, of the body.

12. The electronic device according to claim 1, wherein the gate terminal is a strip type gate terminal.

13. The electronic device according to claim 1, wherein the body includes an oxide layer, and the support is a portion of the oxide layer.

14. A method comprising:

forming a gate terminal on a body including Silicon Carbide;

forming a conductive path on the body, the conductive path configured to be electrically coupled to a generator of a biasing voltage of the gate terminal;

forming a protection element of a solid-state material, coupled to the gate terminal and the conductive path, the protection element being an electrical connection between the gate terminal and the conductive path, the protection element configured to change from a solid state to a melted or gaseous state, interrupting the electrical connection, in response to a leakage current through the protection element greater than a threshold; and forming a buried cavity in the body, at least a portion of the protection element extending through the buried cavity; and forming a support that protrudes into the buried cavity, the portion of the protection element positioned on the support inside of the buried cavity and spaced from the body by the support.

15. The method according to claim 14, wherein the protection element, the gate terminal and the conductive path form a monolithic structure.

16. The method according to claim 14, wherein the protection element partially extends on the gate terminal and on the conductive path, the gate terminal and the conductive path being electrically coupled to each other exclusively by the protection element.

17. A device comprising:

a substrate;

a first insulating layer on the substrate;

an oxide layer on the first insulating layer;

a conductive layer on the first insulating layer and the oxide layer;

a second insulating layer on the conductive layer, the second insulating layer including a first opening and a second opening;

a cavity in the first opening and extending into the oxide layer, a protection element in the cavity, the oxide layer including a supporting portion that supports the protection element and protrudes into the cavity, the protection element being positioned on the supporting portion inside of the cavity;

first conductive material on the second insulating layer at a first side of the cavity; and second conductive material on the conductive layer, in the second opening, and at a second side, opposite to the first side, of the cavity.

18. The device according to claim 17, wherein the protection element is a portion of the conductive layer.

19. The device according to claim 17, wherein the protection element is another conductive layer that extends on portions of the conductive layer at the first and second sides of the cavity.

* * * * *